US007787280B2

(12) United States Patent
Mitani et al.

(10) Patent No.: US 7,787,280 B2
(45) Date of Patent: Aug. 31, 2010

(54) ELECTRIC ELEMENT, MEMORY DEVICE, AND SEMICONDUCTOR INTEGRATED CIRCUIT

(75) Inventors: Satoru Mitani, Osaka (JP); Koichi Osano, Osaka (JP); Shunsaku Muraoka, Osaka (JP); Kumio Nago, Nara (JP)

(73) Assignee: Panasonic Corporation, Osaka (JP)

( * ) Notice: Subject to any disclaimer, the term of this patent is extended or adjusted under 35 U.S.C. 154(b) by 537 days.

(21) Appl. No.: 11/918,361

(22) PCT Filed: Apr. 4, 2006

(86) PCT No.: PCT/JP2006/307114

§ 371 (c)(1), (2), (4) Date: Oct. 12, 2007

(87) PCT Pub. No.: WO2006/109622

PCT Pub. Date: Oct. 19, 2006

(65) Prior Publication Data

US 2009/0067214 A1 Mar. 12, 2009

(30) Foreign Application Priority Data

Apr. 12, 2005 (JP) ............................ 2005-114093

(51) Int. Cl.
*G11C 11/00* (2006.01)

(52) U.S. Cl. ...................................... 365/148; 365/100

(58) Field of Classification Search .................. 365/46, 365/94, 100, 129, 148; 357/E21.35; 438/135
See application file for complete search history.

(56) References Cited

U.S. PATENT DOCUMENTS

| | | | |
|---|---|---|---|
| 6,204,139 B1 | 3/2001 | Liu et al. | |
| 7,577,022 B2 * | 8/2009 | Muraoka et al. | 365/148 |
| 2002/0061421 A1 | 5/2002 | Bernard | |
| 2003/0161079 A1 | 8/2003 | Hiromasa et al. | |
| 2004/0114413 A1 * | 6/2004 | Parkinson et al. | 365/100 |
| 2006/0108625 A1 * | 5/2006 | Lee et al. | 257/310 |
| 2007/0267621 A1 * | 11/2007 | Ufert | 257/4 |

FOREIGN PATENT DOCUMENTS

| | | |
|---|---|---|
| JP | 2002-223015 | 8/2002 |
| JP | 2003-248909 | 9/2003 |
| JP | 2004-342843 | 12/2004 |

OTHER PUBLICATIONS

Gerstner, E.G. et al., "Nonvolatile memory effects in nitrogen doped tetrahedral amorphous carbon thin films," Journal of Applied Physics, vol. 84, No. 10, Nov. 15, 1998.

* cited by examiner

*Primary Examiner*—Richard Elms
*Assistant Examiner*—Harry W Byrne
(74) *Attorney, Agent, or Firm*—McDermott Will & Emery LLP

(57) ABSTRACT

An electric element includes a first terminal (1), a second terminal (3), and a variable-resistance film (2). The variable-resistance film (2) is connected between the first terminal (1) and the second terminal (3). The variable-resistance film (2) includes $Fe_3O_4$ crystal phase and $Fe_2O_3$ crystal phase.

10 Claims, 11 Drawing Sheets

200
201
Row decoder
204
Word line driver
205
W2
W1
T212
MC212
T222
MC222
T211
MC211
T221
MC221
B1
207
P1
B2
P2
Dout
Din
MODE
Control section
203
$I_{READ}$
CONT
207
Bit line/plate line driver
Column decoder
206
ROW
202
Address buffer
COLUMN
ADDRESS 200
204
Row decoder
205
Word line driver
201
Memory array
W2
W1
402
I/F
Din
Control section
203
Dout
$I_{READ}$
B1
P1
B1
P1
Bit line/plate line driver
207
CONT
Column decoder
206
Processor
401
MODE
ROW
202
Address buffer
ADDRESS
COLUMN

ELECTRIC ELEMENT, MEMORY DEVICE, AND SEMICONDUCTOR INTEGRATED CIRCUIT

RELATED APPLICATIONS

This application is the U.S. National Phase under 35 U.S.C. §371 of International Application No. PCT/JP2006/307114, filed on Apr. 4, 2006, which in turn claims the benefit of Japanese Application No. 2005-114093, filed on Apr. 12, 2005, the disclosure of which Application is incorporated by reference herein.

TECHNICAL FIELD

The present invention relates to an electric element, memory device, and semiconductor integrated circuit formed using a state-variable material whose resistance value increases/decreases according to an applied electric pulse.

BACKGROUND ART

In recent years, along with the advancement of the digital techniques in electronic devices, demands for increasing the capacity and data transfer speed on solid-state memory devices have been increasing for storage of data, such as a picture, and the like. To meet such demands, U.S. Pat. No. 6,204,139 discloses a technique for forming a solid-state memory device using a perovskite material whose resistance value varies according to an applied electric pulse (e.g., $Pr_{(1-x)}Ca_xMnO_3$(PCMO), $LaSrMnO_3$(LSMO), $GdBaCo_xO_Y$ (GBCO), etc.). According to the technique disclosed in this publication, a predetermined electric pulse is applied to these materials (hereinafter, referred to as "variable-resistance material(s)") to increase or decrease the resistance value of the materials. The resistance value which has varied as a result of application of the pulse is used for memorization of different values. Based on this scheme, the materials are used for memory devices.

Perovskite materials have been disclosed in U.S. Pat. No. 6,204,139 as a material whose resistance value varies according to an electric pulse. Also, a memory device has been proposed wherein a deep acceptor level and shallow donor level of an amorphous carbon film are used to vary the resistance by injection of charge (J. Appl. Phys., Vol. 84, (1998), p 5647).

Japanese Laid-Open Patent Publication No. 2004-342843 (Patent Document 2) discloses a technique relating to a non-volatile memory device wherein a voltage is applied to an electrode formed of Ag or Cu on an amorphous oxide (e.g., an oxide formed by one or more elements selected from Ti, V, Fe, Co, Y, Zr, Nb, Mo, Hf, Ta, W, Ge, and Si) such that Ag or Cu, which is the material of the electrode, is ionized and diffused in a thin film, whereby the resistance value of the amorphous oxide is varied.

[Patent Document 1] U.S. Pat. No. 6,204,139

[Patent Document 2] Japanese Laid-Open Patent Publication No. 2004-342843

[Non-Patent Document] J. Appl. Phys., Vol. 84, (1998), p 5647

DISCLOSURE OF INVENTION

Problems to be Solved by the Invention

In the formation of a memory device using such a variable-resistance material, it is desirable that in CMOS process the substrate temperature for film formation is 450° C. or lower for the purpose of avoiding a high-temperature collapse, or the like. However, to form a film of a perovskite structure, it is in general necessary to set the substrate temperature for film formation to 700° C. or higher.

In the case where a variable-resistance material, such as a perovskite material, is used for a memory device, it is desirable that the change in resistance caused by application of a predetermined electric pulse is stable (the magnitude of the change in resistance is constant).

An objective of the present invention is to realize stable change in resistance. More specifically, an objective of the present invention is to provide an electric element where the change in resistance is stable even after repetitive application of an electric pulse, and a memory device and semiconductor integrated circuit which utilize the electric element.

Means for Solving the Problems

According to an aspect of the present invention, an electric element includes first and second terminals and a variable-resistance film. The variable-resistance film is connected between the first terminal and the second terminal. The variable-resistance film includes a $Fe_3O_4$ crystal phase and a $Fe_2O_3$ crystal phase.

It was found that application of a predetermined electric pulse to a film including $Fe_3O_4$ crystal phase and $Fe_2O_3$ crystal phase varies the resistance value of the film. Also, it was found that the change in resistance of the film including $Fe_3O_4$ crystal phase and $Fe_2O_3$ crystal phase is stable even after the number of applications of electric pulses increased (the magnitude of change in resistance is substantially constant) as compared with the change in resistance of the conventional variable-resistance film. The above-described electric element can be used as a memory element by, for example, using the change in resistance of the variable-resistance film for memorization and reproduction of information. This memory element is capable of stable memorization and reproduction as compared with the conventional electric elements. Since the substrate temperature for formation of the film including $Fe_3O_4$ crystal phase and $Fe_2O_3$ crystal phase is about 400° C., the film possesses desirable conformity with the semiconductor process. The material of the variable-resistance film is not amorphous but has a microcrystalline structure. Therefore, the variation in characteristics of the film would not occur even after hours of use as compared with the prior art.

Preferably, in the above-described electric element, an electric pulse is applied between the first terminal and the second terminal such that the resistance value of the electric element is increased or decreased, whereby information is recorded. The recorded information is retrieved based on a difference in the resistance value of the electric element.

Preferably, the total of the volume ratio of the $Fe_2O_3$ crystal phase and the volume ratio of the $Fe_3O_4$ crystal phase is 100 volume percents or less. The relative proportion of the $Fe_2O_3$ crystal phase to the $Fe_3O_4$ crystal phase is 95% or less.

In the above-described electric element, a sufficient resistance change ratio can be secured, and a rapid change in resistance can be realized.

Preferably, the thickness of the variable-resistance film used in the above-described electric element is 200 nm or less in view of reduction in electric pulses and fabrication process.

Preferably, at least one of the first terminal and the second terminal is an electrode formed using any of Ag, Au, Pt, Ru, $RuO_2$, Ir and $IrO_2$.

Preferably, the variable-resistance film does not include alkali metal or alkaline-earth metal.

Some perovskite materials, for example, a high-temperature superconductor material and CMR material, include an oxide containing alkali metal and/or alkaline-earth metal. In the case where the memory element is fabricated using such a material, an alkali metal and/or alkaline-earth metal dissolves out at a washing step of the semiconductor process, and therefore, the characteristics of the electric element as a memory device are deteriorated. In the variable-resistance film, deterioration in the characteristics of the electric element which would occur at the washing step of the semiconductor process can be prevented.

According to another aspect of the present invention, a memory device includes: a plurality of word lines; a plurality of bit lines; a plurality of plate lines corresponding to the plurality of bit lines on a one-to-one basis; a plurality of transistors; a plurality of electric elements corresponding to the plurality of transistors on a one-to-one basis; a word line driver for driving the plurality of word lines; and a bit line/plate line driver for driving the plurality of bit lines and the plurality of plate lines. Each of the plurality of transistors and one of the electric elements corresponding to the transistor are connected in series between any one of the plurality of bit lines and one of the plate lines corresponding to the bit line. Each of the plurality of transistors is connected between one of the bit lines corresponding to the transistor and one of the electric elements corresponding to the transistor, the transistor having a gate connected to any one of the plurality of word lines. Each of the plurality of electric elements includes a first electrode connected to one of the transistors corresponding to the electric element, a second electrode connected to one of the plate lines corresponding to the electric element, and a variable-resistance film connected between the first electrode and the second electrode, the variable-resistance film including a $Fe_3O_4$ crystal phase and a $Fe_2O_3$ crystal phase.

In the above-described memory device, the change in resistance of the memory (electric element) is stable so that stable memorization and reproduction can be realized. The material of the variable-resistance film of the memory is not amorphous but has a microcrystalline structure. Therefore, the reliability of the memory as a memory array can be maintained even after hours of use as compared with the prior art.

Preferably, in order to memorize information in any one of the plurality of electric elements, the word line driver applies an activation voltage to one of the plurality of word lines connected to an electric element in which the information is to be memorized. The bit line/plate line driver applies a first electric pulse to one of the plurality of bit lines connected to the electric element in which the information is to be memorized and applies a second electric pulse to one of the plate lines corresponding to the bit line.

In the above-described memory device, a predetermined electric pulse is applied only to an electric element in which information is to be memorized. Therefore, the information can be written in the electric element.

Preferably, in order to reproduce information memorized in any one of the plurality of electric elements, the word line driver applies an activation voltage to one of the plurality of word lines connected to an electric element from which the information is to be retrieved. The bit line/plate line driver applies a first reproduction voltage to one of the plurality of bit lines connected to the electric element from which the information is to be retrieved and applies a second reproduction voltage to one of the plate lines corresponding to the bit line.

In the above-described memory device, a predetermined voltage is applied only to an electric element from which information is to be retrieved. Therefore, the information can be retrieved from the electric element.

According to still another aspect of the present invention, a semiconductor integrated circuit includes: the above-described memory device; and a logic circuit which performs a predetermined operation. The logic circuit has a memorization mode and a process mode. In the memorization mode, the logic circuit stores bit data in the memory device. In the process mode, the logic circuit retrieves bit data stored in the memory device.

According to still another aspect of the present invention, a semiconductor integrated circuit includes: the above-described memory device; and a processor which has a program execution mode and a program rewrite mode. In the program execution mode, the processor operates according to a program stored in the memory device. In the program rewrite mode, the processor rewrites a program stored in the memory device to another new program received from outside.

EFFECTS OF THE INVENTION

As described above, stable change in resistance can be realized.

Figure 1:
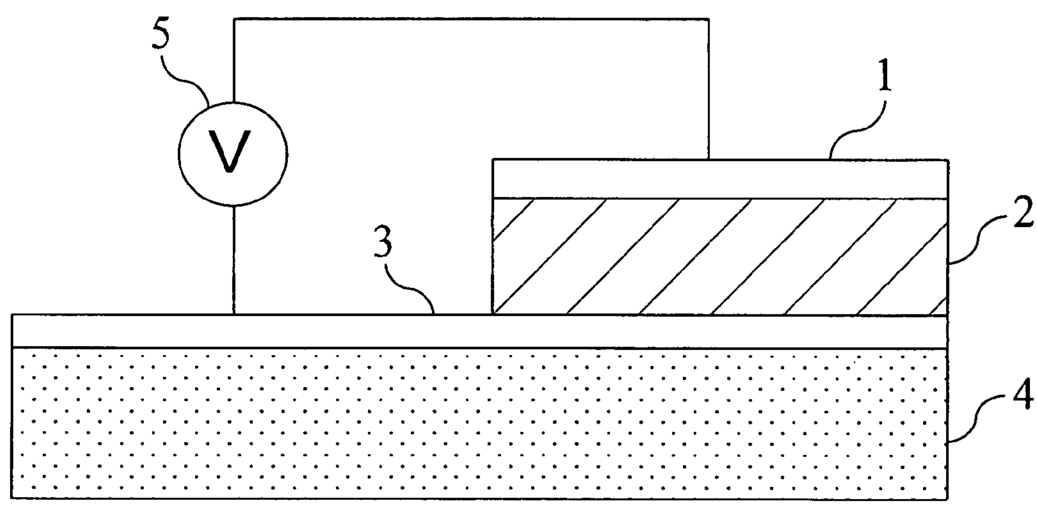
FIG. 1 shows a basic structure of an electric element.

DESCRIPTION OF REFERENCE NUMERALS (1) Upper electrode
(2) Variable-resistance film
(3) Lower electrode

(4) Substrate
101-1, 101-2 Terminals
102 Electric element
200 Memory device
201 Memory array
202 Address buffer
203 Control section
204 Row decoder
205 Word line driver
206 Column decoder
207 Bit line/plate line driver
MC211, MC212, MC221, MC222 Memory cells
W1, W2 Word lines
B1, B2 Bit lines
P1, P2 Plate lines
300 Semiconductor integrated circuit
301 Logic circuit
400 Semiconductor integrated circuit
401 Processor
402 Interface

BEST MODE FOR CARRYING OUT THE INVENTION

Hereinafter, embodiments of the present invention are described in detail with reference to the drawings. Throughout the drawings, like elements are denoted by like reference numerals, and the descriptions thereof are not repeated.

(Basic Characteristics of Electric Element)

The basic structure and basic characteristics of an electric element used in the embodiments of the present invention are described.

FIG. 1 shows a basic structure of the electric element. The electric element includes a substrate 4, a lower electrode 3 formed on the substrate 4, a variable-resistance film 2 formed on the lower electrode 3, and an upper electrode 1 formed on the variable-resistance film 2. A power supply 5 applies a predetermined voltage between the upper electrode 1 and the lower electrode 3. Application by the power supply 5 of a voltage which meets a predetermined condition increases/decreases the resistance value of the electric element. For example, application of an electric pulse having a voltage value greater than a certain threshold decreases the resistance value of the electric element. On the other hand, application of a voltage having a voltage value smaller than the threshold (voltage which does not meet the predetermined condition) does not affect the change in resistance of the electric element (namely, the resistance value of the electric element does not vary).

The variable-resistance film 2 of this embodiment includes $Fe_3O_4$ crystal phase (the phase substantially composed of $Fe_3O_4$ crystals) and $Fe_2O_3$ crystal phase (the phase substantially composed of $Fe_2O_3$ crystals).

<Regarding Variable-Resistance Film>

The characteristics of a film including $Fe_3O_4$ crystal phase and $Fe_2O_3$ crystal phase are described in comparison with a film of $Fe_3O_4$ (single phase) and a film of $Fe_2O_3$ (single phase). It should be noted herein that a film composed of the signal phase of $Fe_3O_4$ crystals is referred to as "$Fe_3O_4$ (single phase) film", a film composed of the signal phase of $Fe_2O_3$ crystals is referred to as "$Fe_2O_3$ (single phase) film", and a film including $Fe_3O_4$ crystal phase and $Fe_2O_3$ crystal phase is referred to as "$Fe_3O_4$+$Fe_2O_3$ (dual-phase) film".

<<Compared Sample 1. $Fe_3O_4$ (Single Phase) Film>>

First, the characteristics of the $Fe_3O_4$ (single phase) film are described.

It is known that, when the temperature is changed, a $Fe_3O_4$ bulk which has a spinel structure undergoes a metal-to-isolator transition called "Verwey transition". However, it is difficult to vary the resistance of the variable-resistance material by applying an electric pulse of about several volts to the $Fe_3O_4$ bulk.

To examine the characteristics of the $Fe_3O_4$ (single phase) film, we prepared Sample (A) by, as shown in FIG. 1, forming the lower electrode 3 over the substrate 4, forming the $Fe_3O_4$ film on the lower electrode 3 by sputtering, or the like, and forming the upper electrode 1 over the film. For this sample, the film was formed by sputtering in an Ar gas atmosphere at the pressure of 0.6 Pa using $Fe_3O_4$ as a target.

[Sample (A)]

Upper electrode 1: Pt (thickness 0.4 μm)

Variable-resistance film 2: $Fe_3O_4$ (thickness 0.1 μm)

Lower electrode 3: Pt (thickness 0.4 μm)

After Sample (A) was thus prepared, an electric pulse which was to make the upper electrode 1 positive (+) with respect to the lower electrode 3 (positive pulse) and an electric pulse which was to make the upper electrode 1 negative (−) with respect to the lower electrode 3 (negative pulse) were alternately applied by the power supply 5 to Sample (A). The electric pulses applied are as follows.

[Applied Electric Pulses]

Applied electric pulses (1st to 64th applications)

Positive pulse: voltage value "+1.6 V", pulse width "100 nsec"

Negative pulse: voltage value "−1.1 V", pulse width "100 nsec"

Applied electric pulses (65th and subsequent applications)

Positive pulse: voltage value "+2 V", pulse width "100 nsec"

Negative pulse: voltage value "−1.1 V", pulse width "100 nsec"

Figure 2:
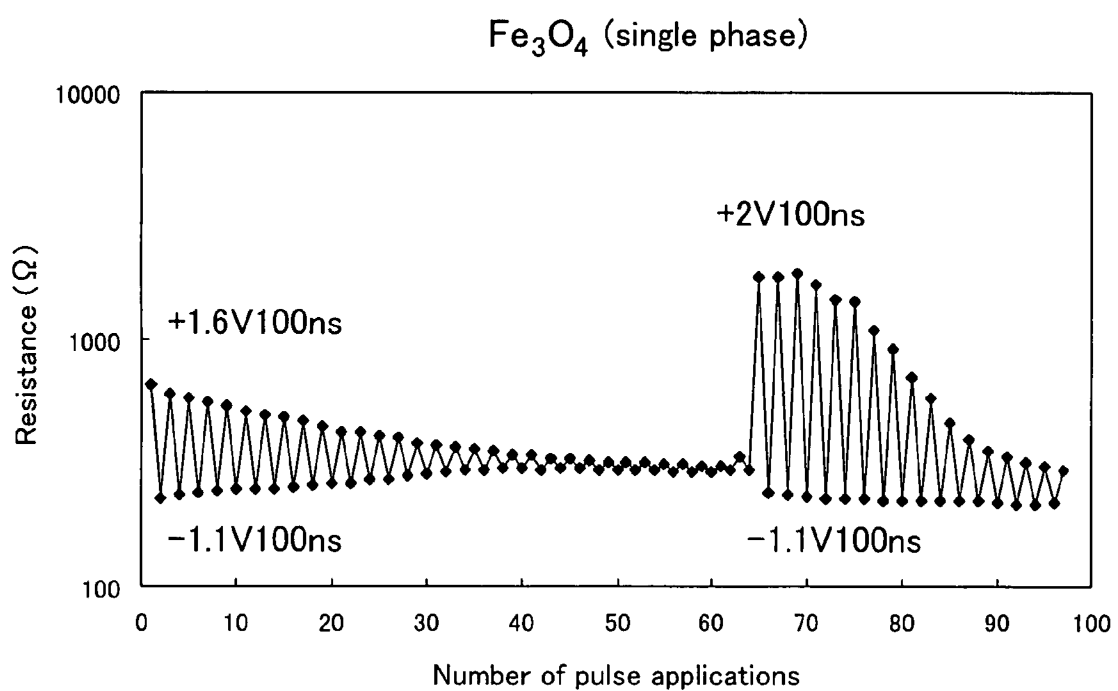
FIG. 2 is a graph showing the change in resistance of $Fe_3O_4$ (single phase).

The resistance value of the variable-resistance film 2 was measured every time application of one electric pulse was completed. The result of the measurement is shown in FIG. 2. As seen from FIG. 2, the resistance value of the $Fe_3O_4$ (single phase) film was initially decreased by application of the negative pulse from about 0.7 kΩ to about 0.25 kΩ (by about 0.45 kΩ) and then increased by application of the positive pulse from about 0.25 kΩ to about 0.6 kΩ (by about 0.35 kΩ). However, as the number of applications of electric pulses increased, the increment/decrement of the resistance value of the $Fe_3O_4$ (single phase) film produced by application of one electric pulse became smaller. After the 40th application, the resistance value of the $Fe_3O_4$ (single phase) film was rarely varied by application of the electric pulse.

The 65th pulse applied was a positive pulse of "+2 V" (which was higher than the previous positive pulses of "+1.6 V"). As a result of application of the 65th pulse, the resistance value of the $Fe_3O_4$ (single phase) film again varied from about 0.3 kΩ to about 2 kΩ. The 66th application with the negative pulse resulted in a change in resistance value of the $Fe_3O_4$ (single phase) film from about 2 kΩ to about 0.25 kΩ. Thereafter, electric pulses of higher voltage values were applied, but nevertheless, the increment/decrement produced by application of one electric pulse became smaller as the number of applications of electric pulses increased.

Thus, it was found that the resistance value of the $Fe_3O_4$ (single phase) film is increased/decreased by application of an electric pulse of about several volts, and that the increment/decrement of the resistance becomes smaller as the number of applications of electric pulses increases.

<<Compared Sample 2. $Fe_2O_3$ (Single Phase) Film>>

Next, the characteristics of the $Fe_2O_3$ (single phase) film are described.

To examine the characteristics of the $Fe_2O_3$ (single phase) film, we prepared Sample (B) by, as shown in FIG. 1, forming the lower electrode 3 over the substrate 4, forming the $Fe_2O_3$ film on the lower electrode 3 by sputtering, or the like, and forming the upper electrode 1 over the film. For this sample, the film was formed by sputtering in an Ar gas atmosphere at the pressure of 3 Pa using $Fe_3O_4$ as a target.

[Sample (B)]

Upper electrode 1: Pt (thickness 0.4 μm)

Variable-resistance film 2: $Fe_2O_3$ (thickness 0.1 μm)

Lower electrode 3: Pt (thickness 0.4 μm)

After Sample (B) was thus prepared, a positive pulse and a negative pulse were alternately applied by the power supply 5 to Sample (B). The electric pulses applied are as follows.

[Applied Electric Pulses]

Positive pulse: voltage value "+4 V", pulse width "100 nsec"

Negative pulse: voltage value "−4 V", pulse width "100 nsec"

Figure 3:
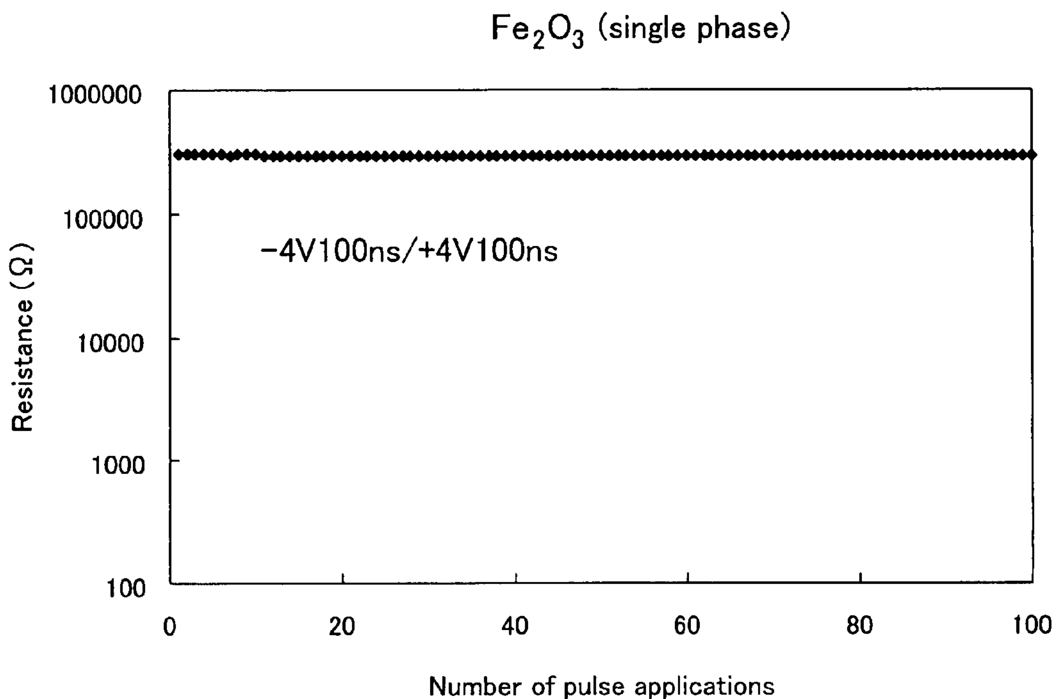
FIG. 3 is a graph showing the change in resistance of $Fe_2O_3$ (single phase).

The resistance value of the variable-resistance film 2 was measured every time application of one electric pulse was completed. The result of the measurement is shown in FIG. 3. As seen from FIG. 3, the resistance value of the $Fe_2O_3$ (single phase) film was rarely varied by application of electric pulses.

Thus, the resistance value of the $Fe_2O_3$ (single phase) film was not varied by application of electric pulses.

<<$Fe_3O_4$+$Fe_2O_3$ (Dual-Phase) Film>>

Next, the characteristics of the $Fe_3O_4$+$Fe_2O_3$ (dual-phase) film are described. We prepared Sample (C) by, as shown in FIG. 1, forming the lower electrode 3 over the substrate 4, forming the film on the lower electrode 3 by sputtering, or the like, and forming the upper electrode 1 over the film. For this sample, the film was formed by sputtering in an Ar gas atmosphere at the pressure of 1.2 Pa using $Fe_3O_4$ as a target.

To examine the crystalline structure of the film of Sample (C), X-ray diffraction analysis was performed on the film of Sample (C), the $Fe_3O_4$ (single phase) film, and the $Fe_2O_3$ (single phase) film.

Figure 4:
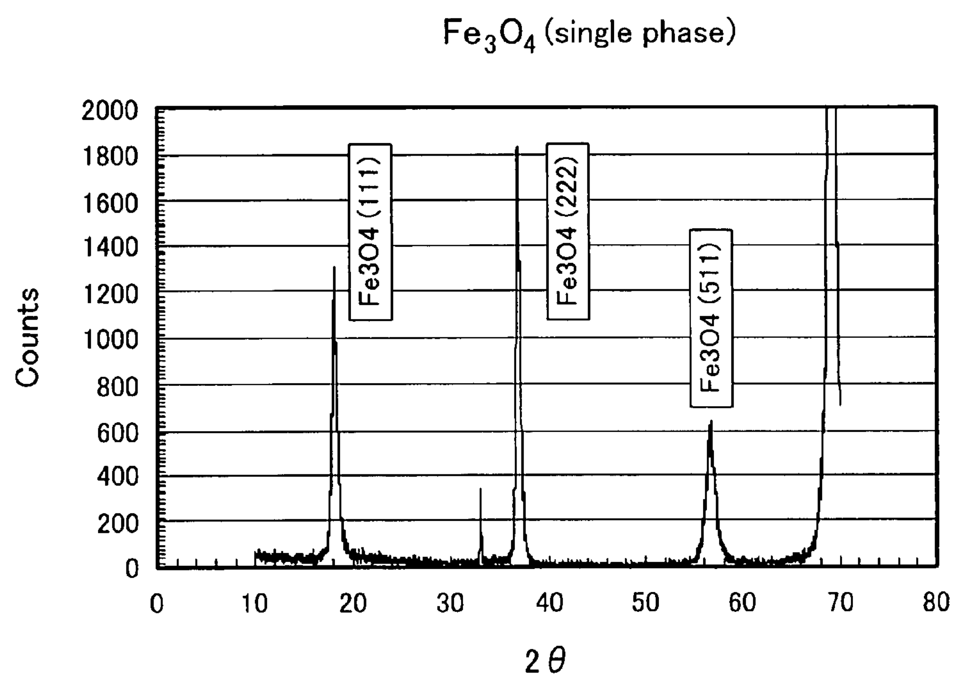
FIG. 4 is a graph showing the result of X-ray diffraction analysis on $Fe_3O_4$ (single phase).

The measurement of diffraction peaks by X-ray diffraction analysis on the $Fe_3O_4$ (single phase) film resulted in the chart of FIG. 4 where a (111) diffraction peak was detected at diffraction angle 2θ=18.2 rad, a (222) diffraction peak was detected at diffraction angle 2θ=36.8 rad, and a (511) diffraction peak was detected at diffraction angle 2θ=56.8 rad.

Figure 5:
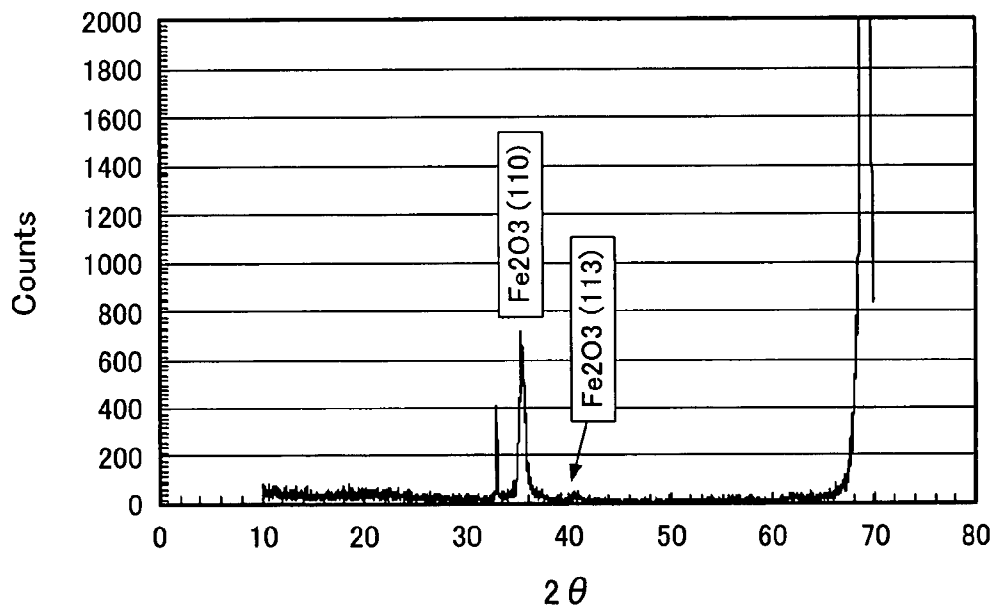
FIG. 5 is a graph showing the result of X-ray diffraction analysis on $Fe_2O_3$ (single phase).

The measurement on the $Fe_2O_3$ (single phase) film resulted in the chart of FIG. 5 where a (110) diffraction peak was detected at diffraction angle 2θ=35.4 rad, and a (113) diffraction peak was detected at diffraction angle 2θ=41.0 rad.

Figure 6:
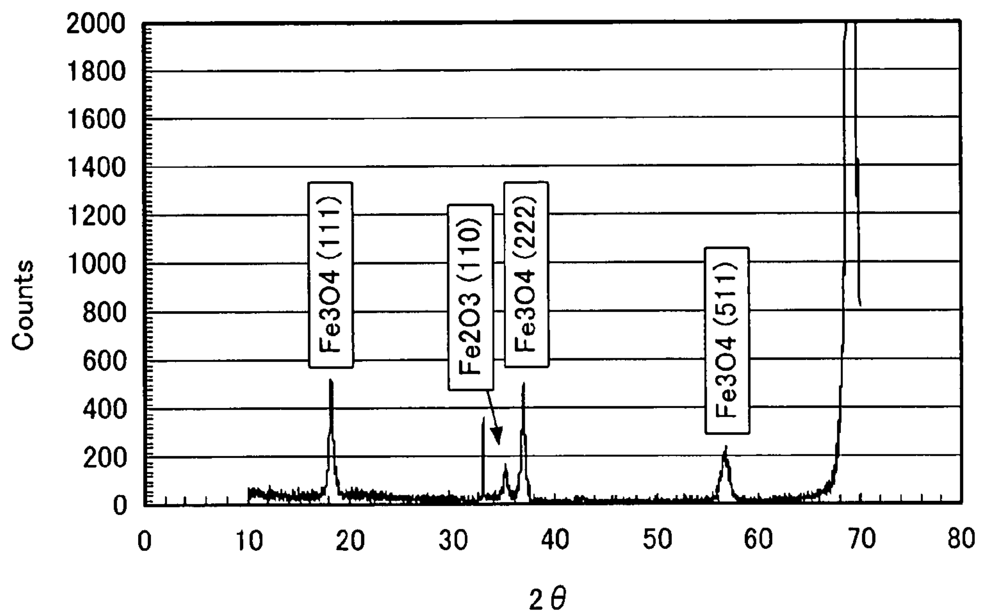
FIG. 6 is a graph showing the result of X-ray diffraction analysis on $Fe_3O_4$+$Fe_2O_3$ (dual-phase) of Sample (C).

The measurement on the film of Sample (C) resulted in the chart of FIG. 6 where a diffraction peak corresponding to (111) of $Fe_3O_4$ was detected at diffraction angle 2θ=18.2 rad, a diffraction peak corresponding to (110) of $Fe_2O_3$ was detected at diffraction angle 2θ=35.2 rad, a diffraction peak corresponding to (222) of $Fe_3O_4$ was detected at diffraction angle 2θ=36.9 rad, and a diffraction peak corresponding to (511) of $Fe_3O_4$ was detected at diffraction angle 2θ=56.9 rad. Namely, it was found that Sample (C) is a film including $Fe_3O_4$ crystal phase and $Fe_2O_3$ crystal phase.

Thus, it was found that film formation from $Fe_3O_4$ by sputtering in the Ar gas atmosphere at the pressure of 1.2 Pa results in a film including $Fe_3O_4$ crystal phase and $Fe_2O_3$ crystal phase.

[Sample (C)]

Upper electrode 1: Pt (thickness 0.4 μm)

Variable-resistance film 2: $Fe_3O_4$+$Fe_2O_3$ (thickness 0.1 μm)

Lower electrode 3: Pt (thickness 0.4 μm)

It should be noted that, in Sample (C), the relative proportion of $Fe_2O_3$ crystal phase in the variable-resistance film was "25%". The "relative proportion" will be described later.

After Sample (C) was thus prepared, a positive pulse and a negative pulse were alternately applied by the power supply 5 to Sample (C). The electric pulses applied are as follows.

[Applied Electric Pulses]

Positive pulse: voltage value "+2.2 V", pulse width "100 nsec"

Negative pulse: voltage value "−2.2 V", pulse width "100 nsec"

Figure 7:
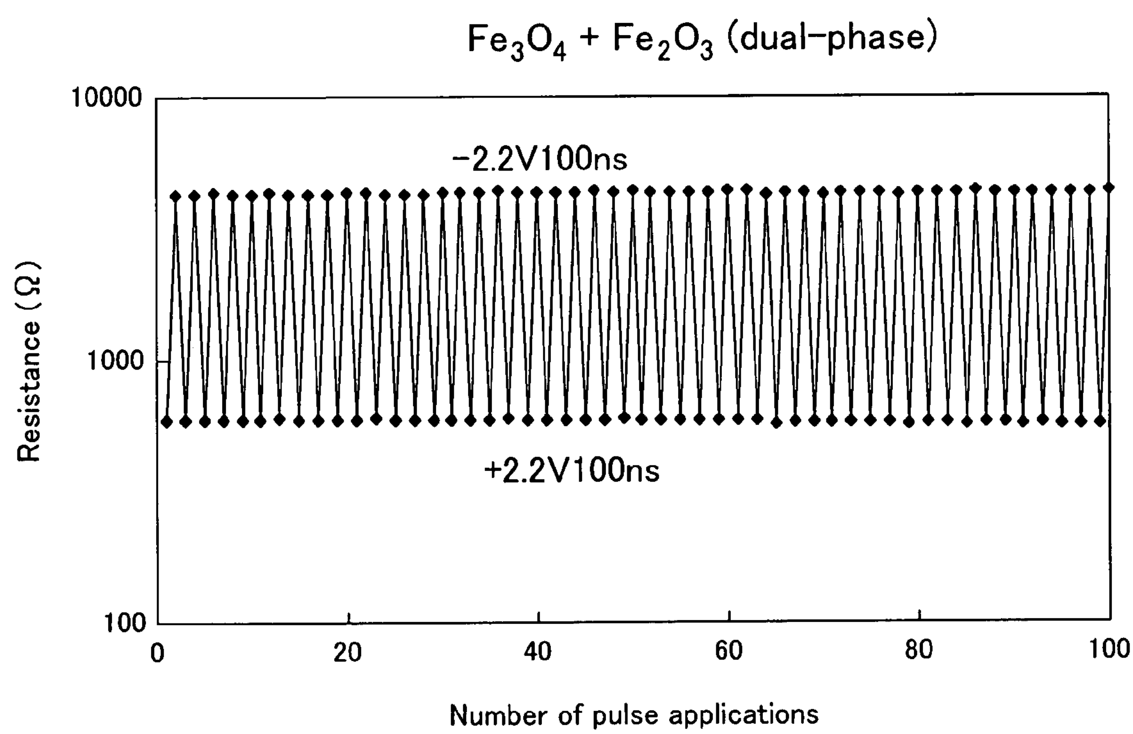
FIG. 7 is a graph showing the change in resistance of $Fe_3O_4$+$Fe_2O_3$ (dual-phase) of Sample (C).

The resistance value of the variable-resistance film 2 was measured every time application of one electric pulse was completed. The result of the measurement is shown in FIG. 7. As seen from FIG. 7, the resistance value of the $Fe_3O_4$+$Fe_2O_3$ (dual-phase) film was decreased by application of the positive pulse from about 5 kΩ to about 0.6 kΩ (by about 4.4 kΩ) but, on the other hand, increased by application of the negative pulse from about 0.6 kΩ to about 5 kΩ (by about 4.4 kΩ). In the case of the $Fe_3O_4$+$Fe_2O_3$ (dual-phase) film, even if the number of applications of electric pulses increased, the change in resistance by about 4.4 kΩ continually occurred (i.e., changes in resistance of substantially equal magnitudes occurred many times).

Thus, it was found that the resistance value of the $Fe_3O_4$+$Fe_2O_3$ (dual-phase) film is increased/decreased by application of an electric pulse of about several volts. It was found that, as compared with the $Fe_3O_4$ (single phase) film, the $Fe_3O_4$+$Fe_2O_3$ (dual-phase) film exhibits stable changes in resistance according to applied electric pulses (the magnitudes of changes in resistance are substantially equal) even if the number of applications of electric pulses increases.

<<Relative Proportion of $Fe_2O_3$ Crystal Phase in $Fe_3O_4$+$Fe_2O_3$ (Dual-Phase) Film>>

To examine the relationship between the relative proportion of $Fe_2O_3$ crystal phase in the variable-resistance film of the electric element and the resistance change ratio of the electric element, a plurality of electric elements having different $Fe_2O_3$ crystal phase relative proportions were prepared. We prepared eight electric elements having $Fe_2O_3$ crystal phase relative proportions of "0%", "3%", "10%", "25%", "50%", "90%", "95%", and "100%". It should be noted that the relative proportion of $Fe_2O_3$ crystal phase in the variable-resistance film of the electric element was calculated using Formula 1 shown below.

$$R=100\times I[Fe_2O_3(110)]/(I[Fe_2O_3(110)]+I[Fe_3O_4(111)]) \quad \text{(Formula 1)}$$

where R is the relative proportion of $Fe_2O_3$ crystal phase in the variable-resistance film [%], $I[Fe_2O_3(110)]$ is X-ray diffraction peak intensity corresponding to $Fe_2O_3(110)$ near 2θ=18 rad, and $I[Fe_3O_4(111)]$ is X-ray diffraction peak intensity corresponding to $Fe_3O_4(111)$ near 2θ=35 rad.

It should be noted that X-ray diffraction peak intensity $I[Fe_2O_3(110)]$ and X-ray diffraction peak intensity $I[Fe_3O_4(111)]$ were both measured under the same conditions.

Positive and negative pulses were alternately applied to each of the prepared electric elements to measure the resistance change ratio. We used three types of electric pulses on one electric element to measure three types of resistance change ratios. It should be noted that, to decrease the effects of variations in characteristics of the electric elements, we prepared 10 samples of each electric element and measured the resistance change ratio in each of the samples. The average of the measurement results for the 10 samples was adopted as the resistance change ratio of the electric element. Some electric elements exhibited a decrease in resistance change ratio as the number of applications of electric pulses increased as shown in FIG. 2. Measurement of the resistance change ratio of such electric elements was carried out after the resistance change ratio of the electric element had converged on a substantially constant value.

[Measured Resistance Change Ratios]

Resistance change ratio resulting from application of an electric pulse having a pulse width of "100 nsec".

Resistance change ratio resulting from application of an electric pulse having a pulse width of "10 μsec".

Resistance change ratio resulting from application of an electric pulse having a pulse width of "1 msec".

In any of the above cases, the absolute value of the voltage value of the electric pulse was "4 V" or lower.

Figure 8:
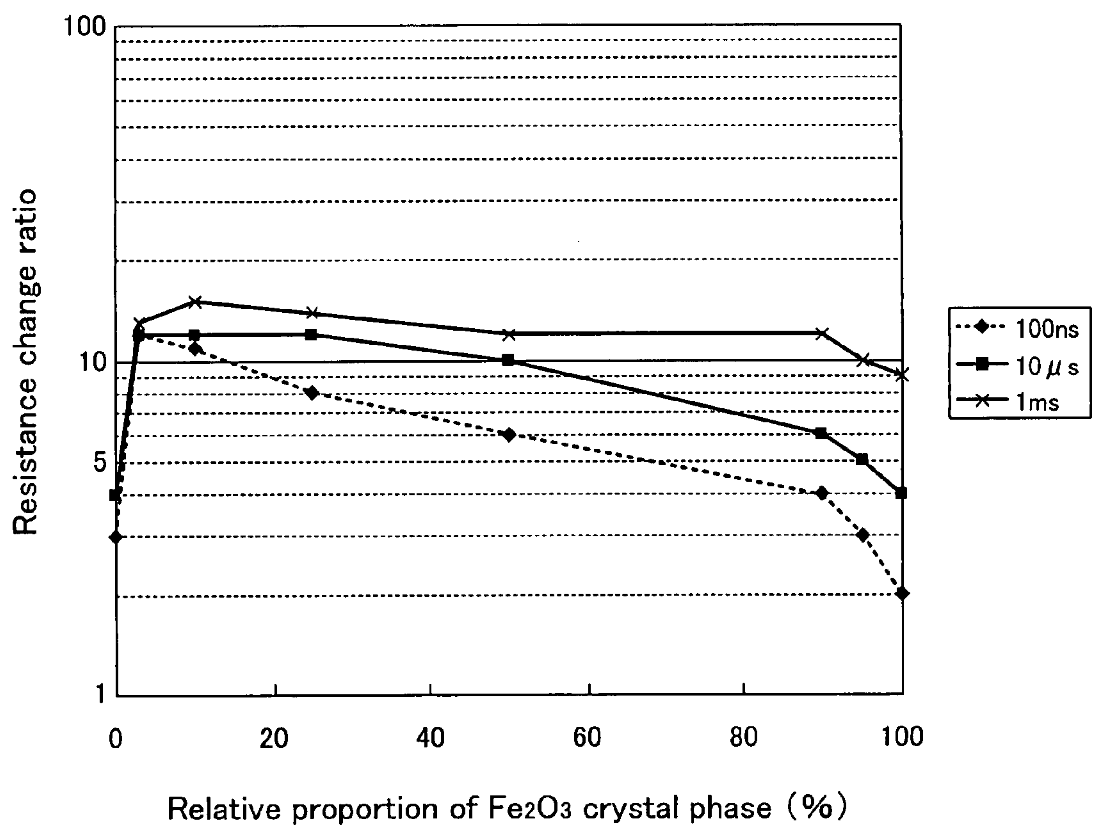
FIG. 8 is a graph showing the relationship between the relative proportion of $Fe_2O_3$ crystal phase in the variable-resistance film and the resistance change ratio.

FIG. 8 shows the experimental results. As seen from FIG. 8, in the range of relative proportion R from 0% to 3% (relative proportion R is too small), the resistance change ratio decreases as relative proportion R decreases. In the range of relative proportion R from 90% to 100% (relative proportion R is too large), the resistance change ratio decreases as relative proportion R increases. In the case of an electric pulse having a short pulse width, the resistance change ratio is especially small.

It was found that, to realize the resistance change ratio of more than fivefold, the relative proportion of $Fe_2O_3$ crystal phase is preferably "1%" or higher. With such an arrangement, sufficient resistance change ratio is secured.

It was also found that, to secure the resistance change ratio of more than fivefold even with the pulse width of "10 μsec", the relative proportion of $Fe_2O_3$ crystal phase is preferably "95%" or lower. With such an arrangement, sufficient resistance change ratio is secured even with a short pulse width, so that a high speed operation can be realized.

<Other Characteristics>

The $Fe_3O_4$+$Fe_2O_3$ (dual-phase) film is formed at the substrate temperature of 400° C. and therefore possesses desirable conformity with the semiconductor process as compared with a material having a perovskite structure.

The $Fe_3O_4$+$Fe_2O_3$ (dual-phase) film does not include any alkali metal or alkaline-earth metal and is therefore capable of suppressing deterioration in the characteristics of the electric element in a washing step of the semiconductor process.

In view of fabrication of the electric element using the semiconductor process, the variable-resistance film 2 desirably has a thickness of 1 μm or less. By shaping a bulk of the resistance-variable material into a film having a thickness of 1 μm or less, it is sufficiently possible to vary the resistance value of the film by an electric pulse.

As the thickness of the variable-resistance film 2 increases, the voltage value of an electric pulse necessary for increasing/decreasing the resistance value of the resistance-variable film needs to be higher. When lithography is employed in the fabrication process, the variable-resistance film 2 is easier to process as its thickness is smaller. Thus, the thickness of the variable-resistance film 2 used in the electric element is desirably 200 nm or less in view of reduction in electric pulses and fabrication process. The electric element of this embodiment is operable as a memory device even if the thickness of the variable-resistance film 2 is 200 nm or less (or 100 nm or less for some films).

Although the variable-resistance film is formed by sputtering, or the like, even if Ar atoms present in a film formation atmosphere, or the like, are mixed in the variable-resistance film during the formation of the variable-resistance film, the Ar atoms do not significantly affect the characteristics of the electric element.

The material used for the upper electrode 1 and lower electrode 3 preferably has a lower work function. For example, the preferable materials include Pt, Ru, Ir, Ag, Au, $RuO_2$, and $IrO_2$. It should be noted that, since the substrate 4 is heated in the common formation procedure of the variable-resistance film 2, the material used for the lower electrode 3 is preferably stable against this heating temperature.

EMBODIMENT 1

Definition of Graphical Symbol

Figure 9:
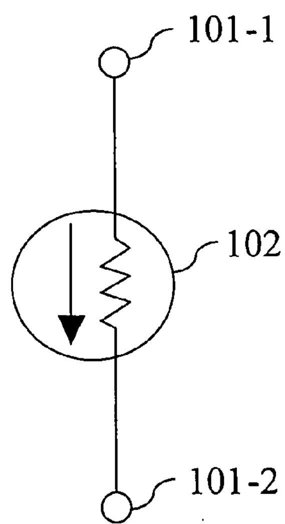
FIG. 9 shows a graphical symbol of an electric element according to embodiment 1 of the present invention.

An electric element of embodiment 1 of the present invention is described. We define the graphical symbol of the electric element of embodiment 1 as shown in FIG. 9. In FIG. 9, the upper electrode 1 of FIG. 1 is connected to a terminal 101-1, while the lower electrode 3 of FIG. 1 is connected to a terminal 101-2.

Figure 10:
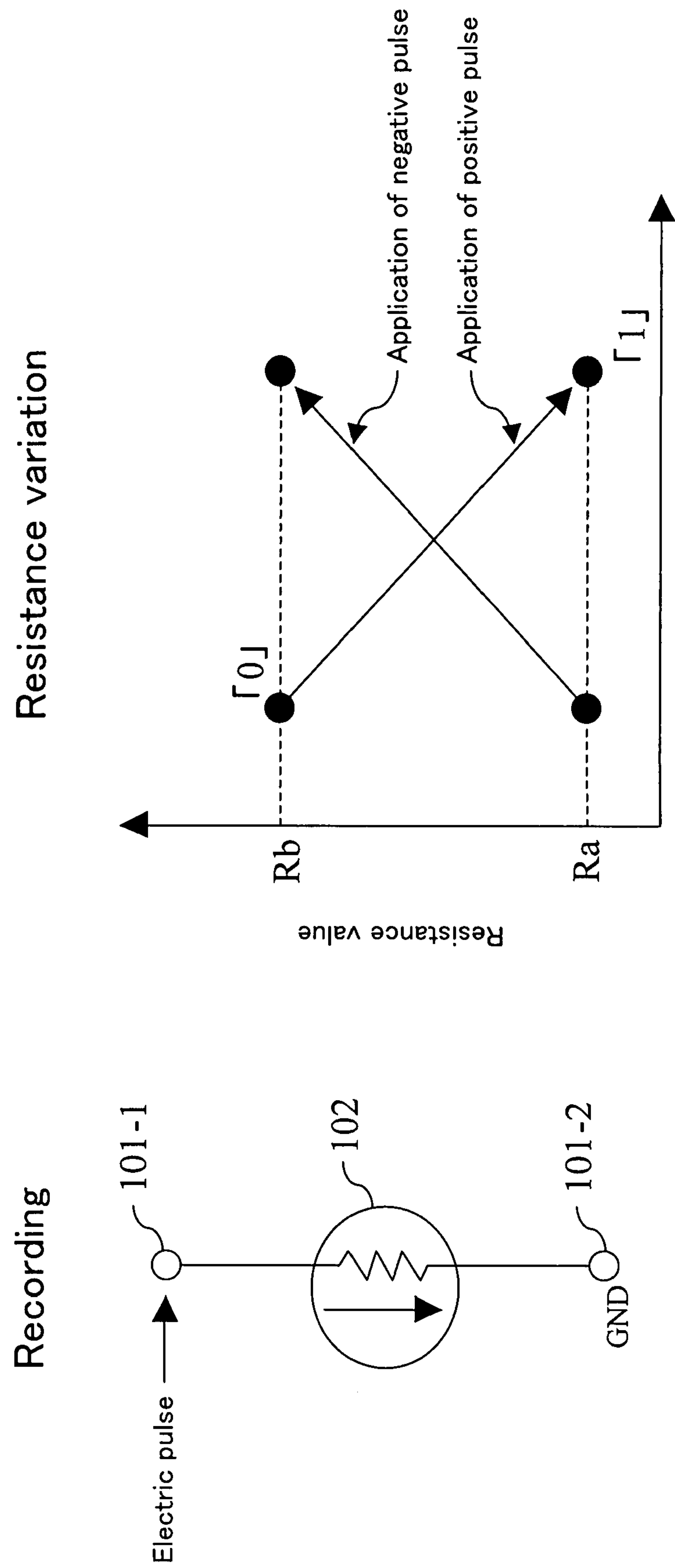
FIG. 10 illustrates the change in resistance of the electric element shown in FIG. 9.

Referring to FIG. 10, when an electric pulse (positive pulse) which is to make the terminal 101-1 positive with respect to the terminal 101-2 is applied to an electric element 102, the resistance value of the electric element 102 decreases. On the contrary, when an electric pulse (negative pulse) which is to make the terminal 101-1 negative with respect to the terminal 101-2 is applied to the electric element 102, the resistance value of the electric element 102 increases. Namely, when an electric pulse is applied such that a current flows in the direction of the arrow, the resistance value of the electric element 102 decreases. On the contrary, when an electric pulse is applied such that a current flows in the direction opposite to the arrow, the resistance value of the electric element 102 increases.

Figure 11:
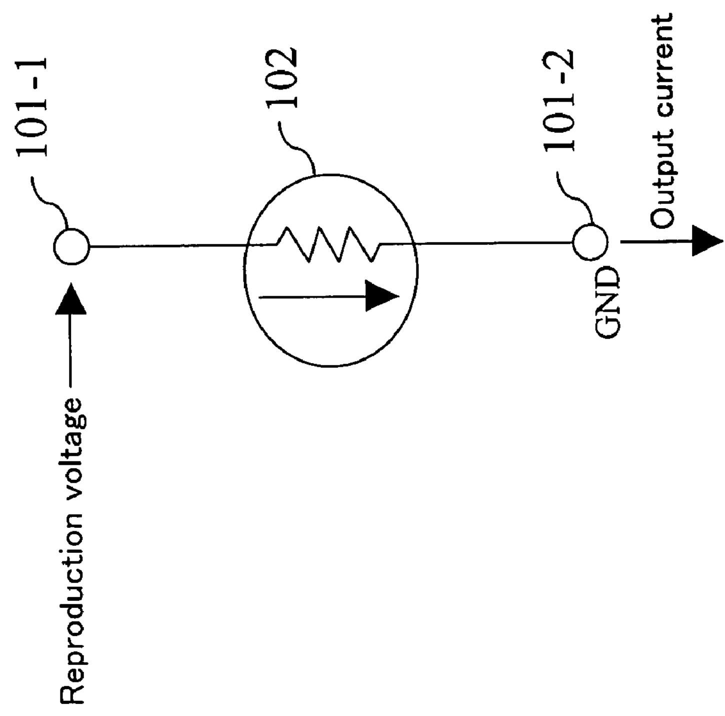
FIG. 11 illustrates an output current of the electric element shown in FIG. 9.
Figure 11:
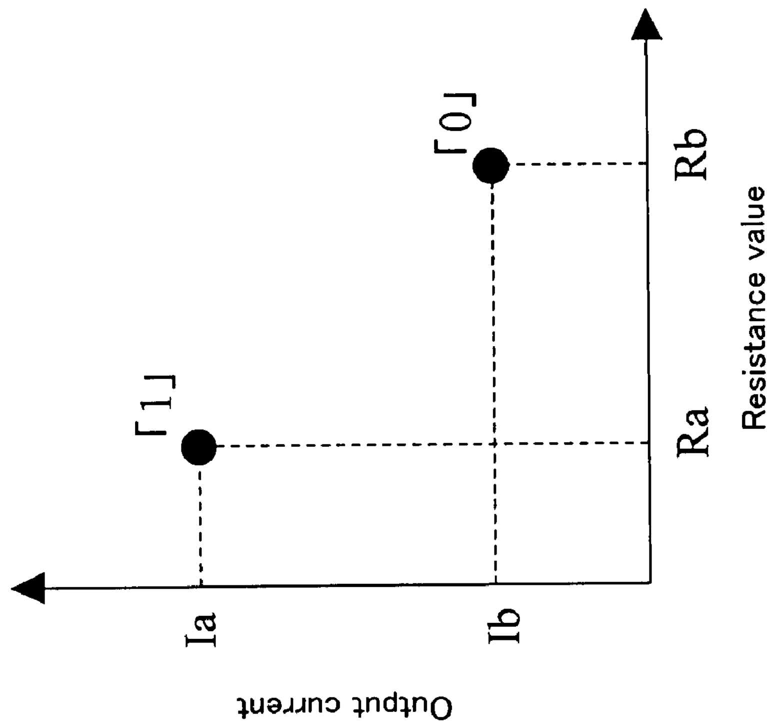

Referring to FIG. 11, when a voltage which does not affect the change in resistance of the electric element (reproduction voltage) is applied, an output current flows according to the resistance value of the electric element 102. Namely, when the resistance value of the electric element 102 is "Ra", an output current which has current value "Ia" flows. When the resistance value of the electric element 102 is "Rb", an output current which has current value "Ib" flows.

<Operation>

Next, the operation of the electric element 102 shown in FIG. 9 is described. Herein, the electric element 102 is used as a memory to perform a process of 1-bit data. It is assumed that the resistance value of the electric element 102 is initialized to a high resistance state. It is further assumed that when the resistance value of the electric element 102 is at "high resistance state", the logical value is "0", and that when the resistance value of the electric element 102 is at "low resistance state", the logical value is "1".

[Memorization]

To write 1-bit data representing "1" in the electric element 102, as illustrated in FIG. 10, the terminal 101-2 is pulled down to the ground, and a memorization voltage is applied to the terminal 101-1. The memorization voltage is, for example, an electric pulse which has a voltage value of +2.2 V and a pulse width of 100 nsec. Since the positive pulse is applied to the electric element 102, the resistance value of the electric element 102 results in the low resistance state. In this way, 1-bit data representing "1" is stored in the electric element 102.

[Reset]

To reset the memory state of the electric element 102 to the initial state, the terminal 101-2 is pulled down to the ground, and a reset voltage is applied to the terminal 101-1. The reset voltage is, for example, an electric pulse which has a voltage value of −2.2 V and a pulse width of 100 nsec. Since the negative pulse is applied to the electric element 102, the resistance value of the electric element 102 returns to the high resistance state. In this way, the memory state of the electric element 102 is returned to the initial state.

[Reproduction]

To read data from the electric element 102, the terminal 101-2 is pulled down to the ground, and a reproduction voltage is applied to the terminal 101-1 as shown in FIG. 11. The reproduction voltage is, for example, a voltage which has a voltage value of +0.5 V. Since the reproduction voltage is applied to the electric element 102, an electric current which has a current value determined according to the resistance value of the electric element 102 flows between the terminal 101-1 and the terminal 101-2. Then, the resistance value of the electric element 102 is calculated based on the current value of the current flowing between the terminal 101-1 and the terminal 101-2 and the voltage value of the reproduction voltage. Assuming herein that the resistance value of the electric element 102 indicative of "high resistance state" corresponds to "0" and the resistance value of the electric element 102 indicative of "low resistance state" corresponds to "1", the above current flow means reproduction of 1-bit data from the electric element 102.

<Effects>

As described above, the electric element can be used as a memory. The electric element exhibits stable changes in resistance even after repetitive application of electric pulses and therefore realizes stable memorization and reproduction as compared with prior art. The material of the variable-resistance film of the memory is not amorphous but has a microcrystalline structure. Therefore, the reliability of the electric element as the memory can be maintained even after hours of use as compared with conventional memory devices.

The voltages applied to the terminal 101-1 and the terminal 101-2 are not limited to the values shown above. The same effects are achieved by applying, for memorization, voltages to the terminal 101-1 and the terminal 101-2 such that a positive pulse is applied to the electric element. Likewise, the same effects are also achieved by applying, for reset, voltages to the terminal 101-1 and the terminal 101-2 such that a negative pulse is applied to the electric element. This basically applies to reproduction.

In this embodiment, values are allocated to two states of resistance for reading and writing "1-bit" data. Alternatively, values may be uniquely allocated to three or more states of resistance for reading and writing "multi-bit" data. In this case, the voltage value of a pulse voltage to be applied or the number of applications of the pulse voltage may be adjusted according to the value of the multi-bit data.

EMBODIMENT 2

General Structure

Figure 12:
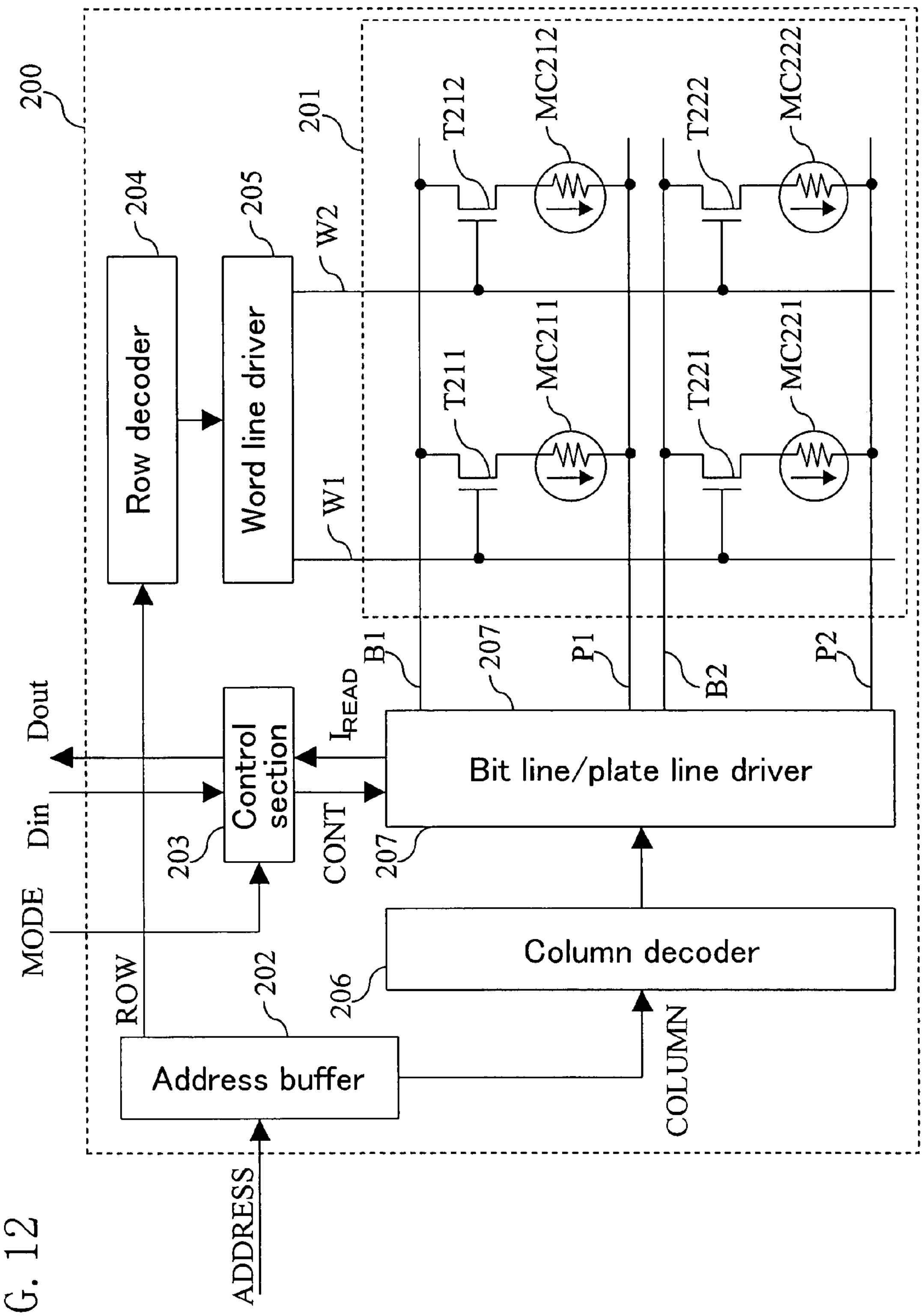
FIG. 12 shows a general structure of a memory device according to embodiment 2 of the present invention.

The general structure of a memory device 200 according to embodiment 2 of the present invention is shown in FIG. 12. The memory device 200 includes a memory array 201, an address buffer 202, a control section 203, a row decoder 204, a word line driver 205, a column decoder 206, and a bit line/plate line driver 207.

The memory array 201 includes word lines W1 and W2, bit lines B1 and B2, plate lines P1 and P2, transistors T211, T212, T221 and T222, and memory cells MC211, MC212, MC221 and MC222. Each of the memory cells MC211, MC212, MC221 and MC222 is the electric element 102 shown in FIG. 9.

The respective connections of the transistors T211 through T222 and the memory cells MC211 through MC222 are equal, and hence, the connection of the transistor T211 and the memory cell MC211 is described as a representative pair. The transistor T211 and the memory cell MC211 are connected in series between the bit line B1 and the plate line P1. The transistor T211 is connected between the bit line B1 and the memory cell MC211, and the gate of the transistor T211 is connected to the word line W1. The memory cell MC211 is connected between the transistor T211 and the plate line P1. Each of the transistors T211 through T222 is rendered conductive when a predetermined voltage (activation voltage) is applied to a word line corresponding to the transistor.

The address buffer 202 receives address signal ADDRESS supplied from the outside of the memory device 200 to output row address signal ROW to the row decoder 204 and output column address signal COLUMN to the column decoder 206. Address signal ADDRESS indicates an address of a memory cell selected from the memory cells MC211, MC212, MC221 and MC222. Row address signal ROW indicates the row address of the address indicated by address signal ADDRESS. Column address signal COLUMN indicates the column address of the address indicated by address signal ADDRESS.

The control section 203 enters any one of memorization mode, reset mode, and reproduction mode according to mode selection signal MODE supplied from the outside of the memory device 200. In the memorization mode, the control section 203 outputs a control signal CONT which indicates "application of memorization voltage" to the bit line/plate line driver 207 according to input data Din supplied from the outside of the memory device 200. In the reproduction mode, the control section 203 outputs a control signal CONT which indicates "application of reproduction voltage" to the bit line/plate line driver 207. In the reproduction mode, the control section 203 outputs to an external device output data Dout indicative of a bit value which is determined according to signal $I_{READ}$ received from the bit line/plate line driver 207. Signal $I_{READ}$ indicates the current value of an electric current flowing through the plate lines P1 and P2 in the reproduction mode. In the reset mode, the control section 203 checks the memory state of the memory cells MC211 through MC222 and outputs a control signal CONT which indicates "application of reset voltage" to the bit line/plate line driver 207 according to the checked memory state.

The row decoder 204 selects any one of the word lines W1 and W2 according to row address signal ROW received from the address buffer 202.

The word line driver 205 applies the activation voltage to a word line selected by the row decoder 204.

The column decoder 206 selects any one of the bit lines B1 and B2 and any one of the plate lines P1 and P2 according to column address signal COLUMN received from the address buffer 202.

When receiving the control signal CONT which indicates "application of memorization voltage" from the control section 203, the bit line/plate line driver 207 applies memorization voltage $V_{WRITE}$ to the bit line selected by the column decoder 206 and pulls the plate line selected by the column decoder 206 to the ground. When receiving the control signal CONT which indicates "application of reproduction voltage"

from the control section 203, the bit line/plate line driver 207 applies reproduction voltage $V_{READ}$ to the bit line selected by the column decoder 206 and pulls the plate line selected by the column decoder 206 to the ground. Thereafter, the bit line/plate line driver 207 outputs to the control section 203 signal $I_{READ}$ which indicates the current value of an electric current flowing through the plate line. When receiving the control signal CONT which indicates "application of reset voltage" from the control section 203, the bit line/plate line driver 207 applies reset voltage $V_{RESET}$ to the bit line selected by the column decoder 206 and pulls the plate line selected by the column decoder 206 to the ground.

Memorization voltage $V_{WRITE}$ is an electric pulse which has, for example, a voltage value of +2.2 V and a pulse width of 100 nsec. Reproduction voltage $V_{READ}$ is a voltage which has, for example, a voltage value of +0.5 V. Reset voltage $V_{RESET}$ is an electric pulse which has, for example, a voltage value of −2.2 V and a pulse width of 100 nsec.

<Operation>

Next, an operation of the memory device 200 shown in FIG. 12 is described. The operation modes of the memory device 200 include the memorization mode where input data Din is written in a memory cell, the reset mode where information written in a memory cell is reset, and the reproduction mode where information written in a memory cell is output (reproduced) as output data Dout. It is assumed herein that the memory cells MC211 through MC222 are initialized to the high resistance state. It is further assumed that address signal ADDRESS indicates the address of the memory cell MC211.

[Memorization Mode]

In the first place, the operation in the memorization mode is described.

When input data Din represents "1", the control section 203 outputs a control signal CONT which indicates "application of memorization voltage" to the bit line/plate line driver 207. When input data Din represents "0", the control section 203 does not output a control signal CONT.

Receiving the control signal CONT which indicates "application of memorization voltage" from the control section 203, the bit line/plate line driver 207 applies memorization voltage $V_{WRITE}$ to the bit line B1 selected by the column decoder 206 and pulls the plate line P1 selected by the column decoder 206 to the ground.

In the meantime, the word line driver 205 applies the activation voltage to the word line W1 selected by the row decoder 204.

Since the above conditions mean that an electric pulse (positive pulse) which has a voltage value of +2.2 V and a pulse width of 100 nsec is applied to the memory cell MC211, the resistance value of the memory cell MC211 results in the low resistance state.

Since the positive pulse is not applied to the memory cell MC212, MC221 or MC222, the resistance states of the memory cells MC212, MC221 and MC222 do not change.

Thus, since only the resistance state of the memory cell MC211 changes to the "low resistance state", 1-bit data representing "1" is written in the memory cell MC211.

After the writing of data in the memory cell MC211 has been completed, new address signal ADDRESS is input to the address buffer 202, and the above-described operation in the memorization mode is repeated.

[Reproduction Mode]

Next, the operation in the reproduction mode is described.

The control section 203 outputs a control signal CONT which indicates "application of reproduction voltage" to the bit line/plate line driver 207.

Receiving the control signal CONT which indicates "application of reproduction voltage" from the control section 203, the bit line/plate line driver 207 applies reproduction voltage $V_{READ}$ to the bit line B1 selected by the column decoder 206 and pulls the plate line P1 selected by the column decoder 206 to the ground.

In the meantime, the word line driver 205 applies the activation voltage to the word line W1 selected by the row decoder 204.

Since the above conditions mean that a voltage (measurement voltage) which has a voltage value of 0.5 V is applied to the memory cell MC211, an electric current having a current value determined according to the resistance value of the memory cell MC211 flows through the memory cell MC211 and then flows out to the bit line B1.

Since the measurement voltage is not applied to the memory cell MC212, MC221 or MC222, no current flows through the memory cells MC212, MC221 or MC222.

Then, the bit line/plate line driver 207 measures the current value of an electric current flowing through the plate line P1 and outputs to the control section 203 signal $I_{READ}$ which indicates the measured current value. The control section 203 then outputs to an external device output data Dout which is determined according to the current value indicated by signal $I_{READ}$. For example, if the measured current value is a current value of an electric current which flows in the case of the low resistance state, output data Dout which is output from the control section 203 represents "1".

Thus, since an electric current flows only through the memory cell MC211 and the electric current flows out to the plate line P1, 1-bit data is read from the memory cell MC211.

After the reading of data from the memory cell MC211 has been completed, new address signal ADDRESS is input to the address buffer 202, and the above-described operation in the reproduction mode is repeated.

[Reset Mode]

Next, the operation in the reset mode is described.

The control section 203 checks the memory state of the memory cell MC211 through the process of the reproduction mode.

In the case where the control section 203 determines that the memory cell MC211 stores bit data representing "1" (the memory cell MC211 is at the low resistance state), the control section 203 outputs a control signal CONT which indicates "application of reset voltage" to the bit line/plate line driver 207. In the case where the memory cell MC211 stores bit data representing "0" (the memory cell MC211 is at the high resistance state), the control section 203 does not output a control signal CONT.

Receiving the control signal CONT which indicates "application of reset voltage" from the control section 203, the bit line/plate line driver 207 applies reset voltage $V_{RESET}$ to the bit line B1 selected by the column decoder 206 and pulls the plate line P1 selected by the column decoder 206 to the ground.

In the meantime, the word line driver 205 applies the activation voltage to the word line W1 selected by the row decoder 204.

Since the above conditions mean that an electric pulse (negative pulse) which has a voltage value of −2.2 V and a pulse width of 100 nsec is applied to the memory cell MC211, the resistance value of the memory cell MC211 results in the high resistance state.

Since the negative pulse is not applied to the memory cell MC212, MC221 or MC222, the resistance states of the memory cells MC212, MC221 and MC222 do not change.

Thus, since only the resistance state of the memory cell MC211 changes to the "high resistance state", 1-bit data stored in the memory cell MC211 is reset.

After the resetting of the memory cell MC211 has been completed, new address signal ADDRESS is input to the address buffer 202, and the above-described operation in the reset mode is repeated.

<Effects>

As described above, the electric element can be used as a memory array. The material of the variable-resistance film of the memory is not amorphous but has a microcrystalline structure. Therefore, the reliability of the electric element as the memory array can be maintained even after hours of use as compared with conventional memory devices.

FIG. 12 shows only four memory cells but the present invention is not limited thereto. For example, 5 or more memory cells may be arranged in a matrix.

EMBODIMENT 3

Structure

Figure 13:
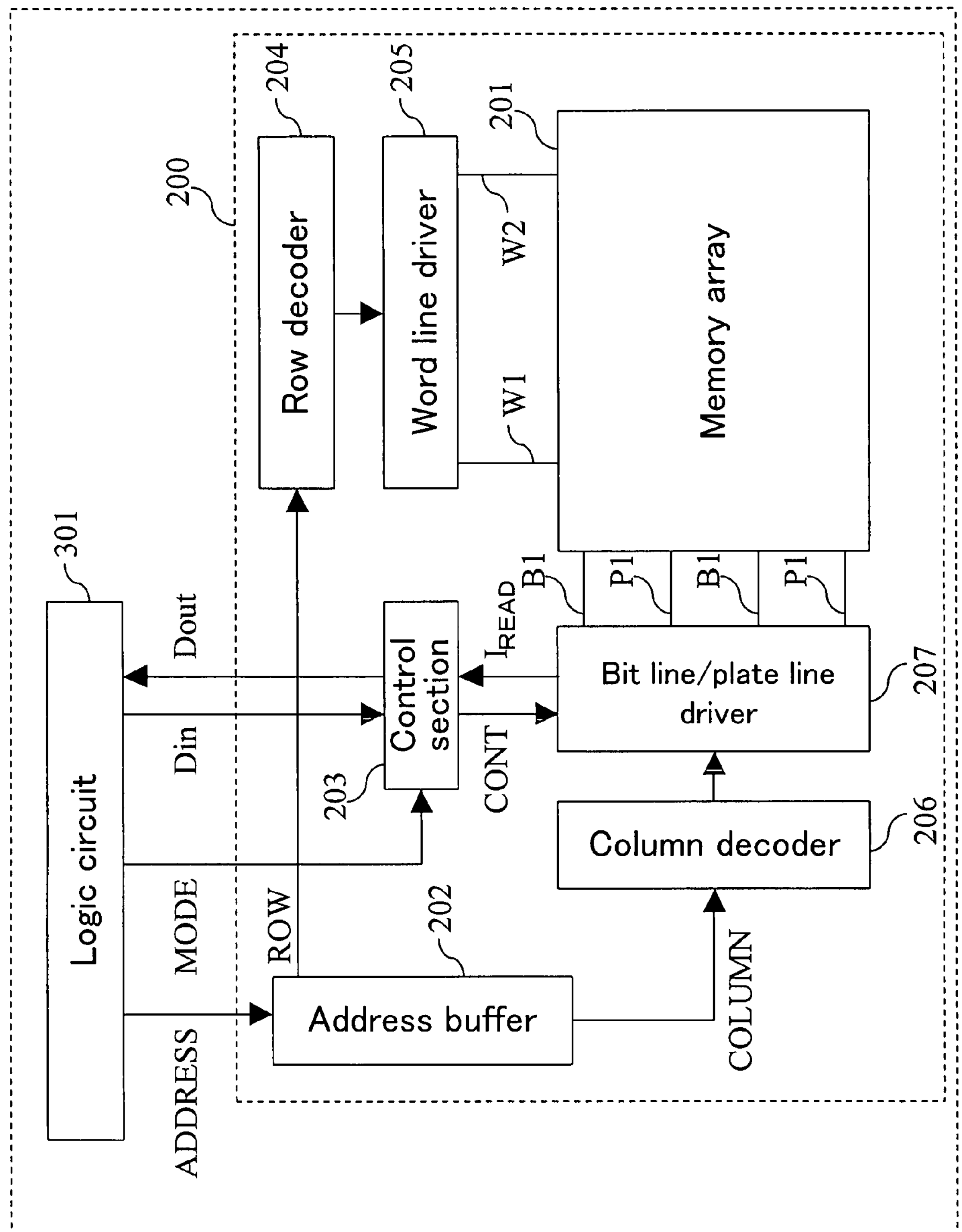
FIG. 13 shows a general structure of a semiconductor integrated circuit according to embodiment 3 of the present invention.

The structure of a semiconductor integrated circuit (Embedded-RAM) 300 according to embodiment 3 of the present invention is shown in FIG. 13. The circuit 300 includes the memory device 200 shown in FIG. 12 and a logic circuit 301 and is formed as a single semiconductor chip. The memory device 200 is used as a data RAM. The logic circuit 301 is a circuit which performs a predetermined operation (e.g., encoding or decoding of sound data or image data) and uses the memory device 200 in the operation. The logic circuit 301 controls address signal ADDRESS and mode selection signal MODE which are supplied to the memory device 200 to write data in or read data from the memory device 200.

<Operation>

Next, the operation of the semiconductor integrated circuit (Embedded-RAM) 300 shown in FIG. 13 is described. The operation of the circuit 300 includes a write process for writing predetermined data (bit data) in the memory device 200, a read process for reading data written in the memory device 200, and a reset process for resetting data written in the memory device 200.

[Write Process]

In the first place, the write process is described.

To write predetermined data (for example, encoded moving picture data, or the like) in the memory device 200, the logic circuit 301 outputs a mode selection signal MODE which indicates "memorization mode" to the control section 203 of the memory device 200.

Then, to select memory cells in which the predetermined data is to be written, the logic circuit 301 sequentially outputs address signals ADDRESS to the address buffer 202 of the memory device 200. As a result, in the memory device 200, memory cells are sequentially selected according to address signals ADDRESS.

Then, the logic circuit 301 outputs the predetermined data on a bit-by-bit basis as 1-bit data Din to the control section 203 of the memory device 200.

Then, in the memory device 200, the same operation as that of the memorization mode of embodiment 2 is performed. As a result, the predetermined data is written in the memory device 200 on a bit-by-bit basis.

[Read Process]

Next, the read process is described.

To read data written in the memory device 200, the logic circuit 301 outputs a mode selection signal MODE which indicates "reproduction mode" to the control section 203 of the memory device 200.

Then, to select memory cells from which written data is to be read, the logic circuit 301 sequentially outputs address signals ADDRESS to the address buffer 202 of the memory device 200. As a result, in the memory device 200, memory cells are sequentially selected according to address signals ADDRESS.

Then, in the memory device 200, the same operation as that of the reproduction mode of embodiment 2 is performed. As a result, the data stored in the memory device 200 is read on a bit-by-bit basis as output data Dout.

[Reset Process]

Next, the reset process is described.

To reset data written in the memory device 200, the logic circuit 301 outputs a mode selection signal MODE which indicates "reset mode" to the control section 203 of the memory device 200.

Then, to select memory cells in which stored data is to be reset, the logic circuit 301 sequentially outputs address signals ADDRESS to the address buffer 202 of the memory device 200. As a result, in the memory device 200, memory cells are sequentially selected according to address signals ADDRESS.

Then, in the memory device 200, the same operation as that of the reset mode of embodiment 2 is performed. As a result, the data stored in the memory device 200 is reset on a bit-by-bit basis.

<Effects>

As described above, a large amount of information can be stored quickly in the memory device.

EMBODIMENT 4

Structure

Figure 14:
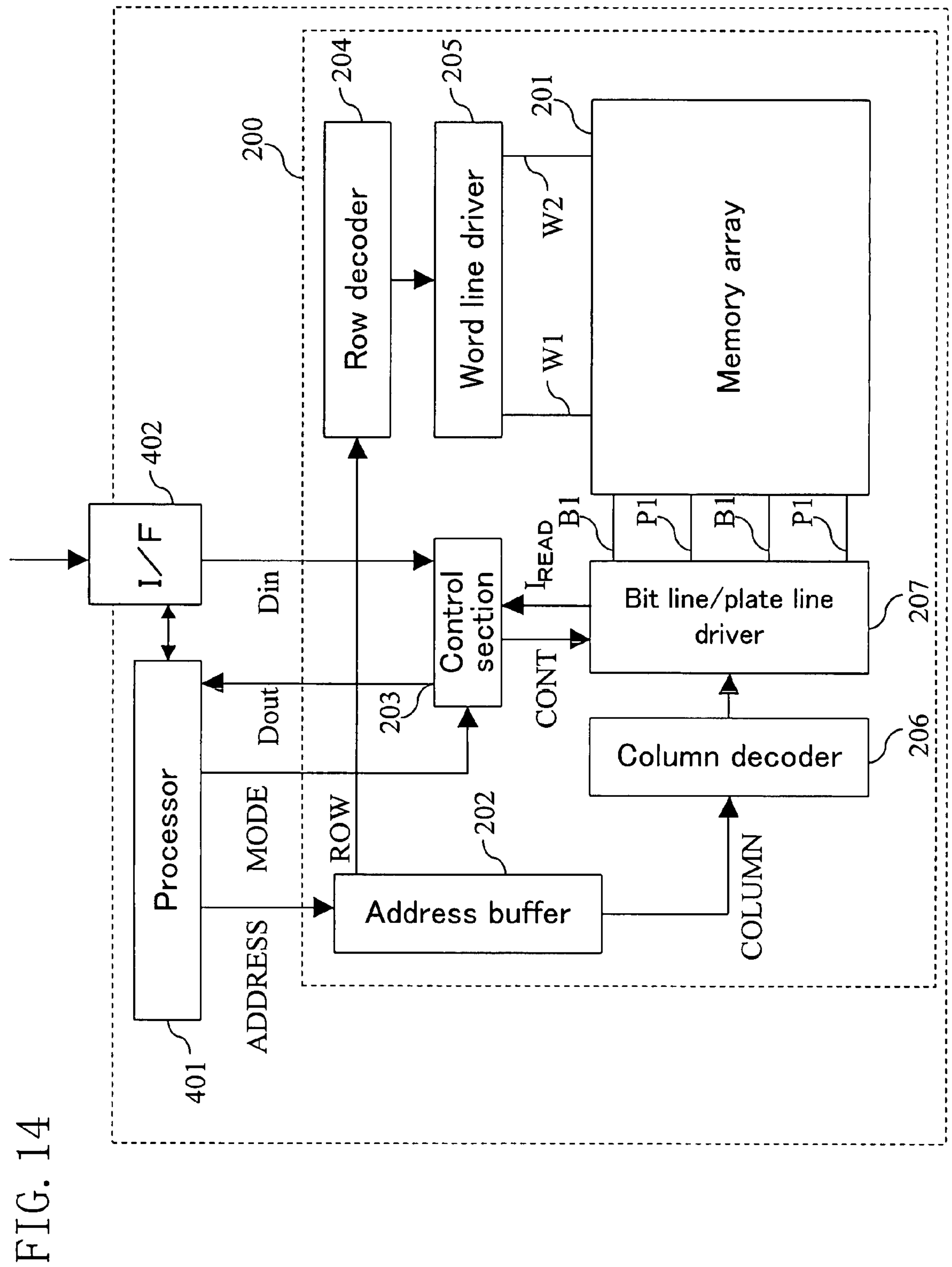
FIG. 14 shows a general structure of a semiconductor integrated circuit according to embodiment 4 of the present invention.

The structure of a semiconductor integrated circuit (reconfigurable LSI) 400 according to embodiment 4 of the present invention is shown in FIG. 14. The circuit 400 includes the memory device 200 shown in FIG. 12, a processor 401 and an interface 402 and is formed as a single semiconductor chip. The memory device 200 is used as a program ROM to store a program necessary for the operation of the processor 401. The processor 401 operates according to the program stored in the memory device 200 to control the memory device 200 and the interface 402. The interface 402 sequentially outputs to the memory device 200 a program supplied from an external device.

<Operation>

Next, the operation of the semiconductor integrated circuit (reconfigurable LSI) 400 shown in FIG. 14 is described. The operation of the circuit 400 includes a program execution process wherein the circuit 400 operates according to a stored program and a program rewrite process for rewriting the program stored in the memory device 200 to another new program.

[Program Execution Process]

In the first place, the program execution process is described.

To read a program stored in the memory device 200, the processor 401 outputs a mode selection signal MODE which indicates "reproduction mode" to the control section 203 of the memory device 200.

Then, the processor 401 sequentially outputs to the address buffer 202 of the memory device 200 address signals ADDRESS indicative of memory cells in which the required program is stored. As a result, in the memory device 200, memory cells are sequentially selected according to address signals ADDRESS.

Then, in the memory device 200, the same operation as that of the reproduction mode of embodiment 2 is performed. As a result, the program stored in the memory device 200 is read on a bit-by-bit basis as output data Dout.

Then, the processor 401 performs a predetermined operation according to the program read from the memory device 200.

[Program Rewrite Process]

Next, the program rewrite process is described.

To erase a program stored in the memory device 200 (a program which is to be rewritten), the processor 401 outputs a mode selection signal MODE which indicates "reset mode" to the control section 203 of the memory device 200.

Then, the processor 401 sequentially outputs to the address buffer 202 of the memory device 200 address signals ADDRESS indicative of memory cells storing the program to be rewritten. As a result, in the memory device 200, memory cells are sequentially selected according to address signals ADDRESS.

Then, in the memory device 200, the same operation as that of the reset mode of embodiment 2 is performed. As a result, the program stored in the memory cells is reset on a bit-by-bit basis.

After the completion of the resetting of the memory cells, the processor 401 outputs a mode selection signal MODE which indicates "memorization mode" to the control section 203 of the memory device 200 in order to write a new program.

Then, the processor 401 sequentially outputs to the address buffer 202 of the memory device 200 address signals ADDRESS which indicate the positions of memory cells in which a new program is to be stored. As a result, in the memory device 200, memory cells are sequentially selected according to address signals ADDRESS.

Then, the processor 401 outputs a new program supplied from an external device through the interface 402 to the control section 203 of the memory device 200 on a bit-by-bit basis. In the memory device 200, the same operation as that of the memorization mode of embodiment 2 is performed. As a result, the new program is stored in the memory device 200 on a bit-by-bit basis.

Thus, since the memory device 200 is a rewritable nonvolatile memory, it is possible to rewrite a program stored in the memory device 200. That is, the function realized in the processor 401 can be changed. Further, it is possible that a plurality of programs are stored in the memory device 200, and the function realized in the processor 401 can be changed according to a program read out from the memory device 200.

<Effects>

As described above, different functions can be realized with a single LSI, i.e., a reconfigurable LSI is realized.

In the above descriptions, the resistance state of the electric element can be changed when an applied electric pulse satisfies predetermined conditions. Thus, in the memorization and reset operations, an electric pulse which satisfies corresponding conditions is applied to the electric element, and in the reproduction operation, a voltage which does not satisfy the conditions is applied to the electric element, whereby the same effects can be achieved. That is, although in the above-described example the resistance state of the electric element changes from "high resistance state" to "low resistance state" when a positive pulse having a voltage value of +2.5 V and a pulse width of 100 nsec is applied, the same effects can be achieved even when the applied pulse voltage has a different voltage value and a different pulse width. Depending on the method of forming which corresponds to initialization of the electric element, the resistance state of the electric element may change from "high resistance state" to "low resistance state" by application of a negative pulse.

Figure 15A:
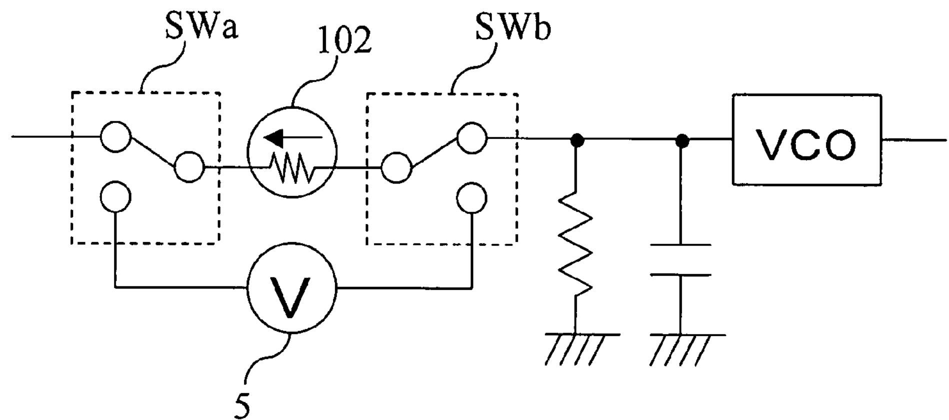
FIG. 15A shows an example of uses of an electric element.
Figure 15B:
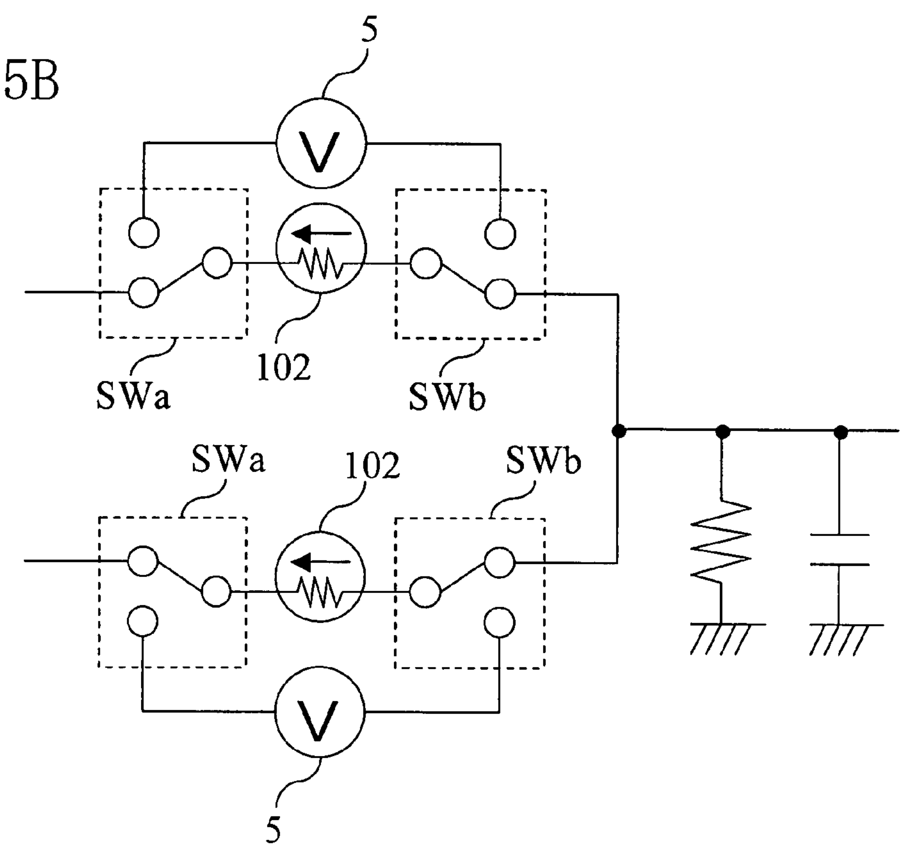
FIG. 15B shows another example of uses of an electric element.

Although in the above-described examples of the embodiments an electric element of the present invention is used as a "memory device", the present invention is not limited to this use. For example, an electric element of the present invention can be used as a switching element for switching a plurality of signals, a variable-resistance element used for switching the frequency (see FIG. 15A), a variable-resistance element for determining the mixture ratio of signals (see FIG. 15B), a time constant changer element used in combination with a capacitor to determine the time constant, etc. For example, in FIG. 15A and FIG. 15B, in order to change the resistance value of the electric element 102, switches SWa and SWb are switched to electrically connect the electric element 102 and power supply 5. Then, the power supply 5 applies a predetermined electric pulse to the electric element 102, whereby the resistance value of the electric element 102 is changed. Then, the switches SWa and SWb are restored to the default connection state. In this way, the electric element 102 is used as a variable-resistance element to realize a frequency-variable circuit (FIG. 15A) and a mixing circuit for changing the mixture ratio (FIG. 15B).

INDUSTRIAL APPLICABILITY

An electric element of the present invention exhibits stable changes in resistance and is therefore useful for a nonvolatile memory, a variable-resistance element, etc.

The invention claimed is:

1. An electric element, comprising:

first and second terminals; and a variable-resistance film connected between the first terminal and the second terminal, wherein the variable-resistance film includes a $Fe_3O_4$ crystal phase and a $Fe_2O_3$ crystal phase, and an electric pulse is applied between the first terminal and the second terminal such that the resistance value of the electric element is increased or decreased, whereby information is recorded, and the recorded information is retrieved based on a difference in the resistance value of the electric element.

2. The electric element of claim 1, wherein:

the total of the volume ratio of the $Fe_2O_3$ crystal phase and the volume ratio of the $Fe_3O_4$ crystal phase is 100 volume percents or less; and the relative proportion of the $Fe_2O_3$ crystal phase to the $Fe_3O_4$ crystal phase is 95% or less.

3. The electric element of claim 1, wherein the thickness of the variable-resistance film is 200 nm or less.

4. The electric element of claim 1, wherein at least one of the first terminal and the second terminal is an electrode formed using any of Pt, Ru, Ir, Ag, Au, $RuO_2$ and $IrO_2$.

5. The electric element of claim 1, wherein the variable-resistance film does not include alkali metal or alkaline-earth metal.

6. A memory device, comprising:

a plurality of word lines;

a plurality of bit lines;

a plurality of plate lines corresponding to the plurality of bit lines on a one-to-one basis;

a plurality of transistors;

a plurality of electric elements corresponding to the plurality of transistors on a one-to-one basis;

a word line driver for driving the plurality of word lines; and a bit line/plate line driver for driving the plurality of bit lines and the plurality of plate lines, wherein each of the plurality of transistors and one of the electric elements corresponding to the transistor are connected in series between any one of the plurality of bit lines and one of the plate lines corresponding to the bit line, each of the plurality of transistors is connected between one of the bit lines corresponding to the transistor and one of the electric elements corresponding to the transistor, the transistor having a gate connected to any one of the plurality of word lines, each of the plurality of electric elements includes a first electrode connected to one of the transistors corresponding to the electric element, a second electrode connected to one of the plate lines corresponding to the electric element, and a variable-resistance film connected between the first electrode and the second electrode, the variable-resistance film including a $Fe_3O_4$ crystal phase and a $Fe_2O_3$ crystal phase, and an electric pulse is applied between the first terminal and the second terminal such that the resistance value of the electric element is increased or decreased, whereby information is recorded, and the recorded information is retrieved based on a difference in the resistance value of the electric element.

7. The memory device of claim 6 wherein, in order to memorize information in any one of the plurality of electric elements, the word line driver applies an activation voltage to one of the plurality of word lines connected to an electric element in which the information is to be memorized, and the bit line/plate line driver applies a first electric pulse to one of the plurality of bit lines connected to the electric element in which the information is to be memorized and applies a second electric pulse to one of the plate lines corresponding to the bit line.

8. The memory device of claim 6 wherein, in order to reproduce information memorized in any one of the plurality of electric elements, the word line driver applies an activation voltage to one of the plurality of word lines connected to an electric element from which the information is to be retrieved, and the bit line/plate line driver applies a first reproduction voltage to one of the plurality of bit lines connected to the electric element from which the information is to be retrieved and applies a second reproduction voltage to one of the plate lines corresponding to the bit line.

9. A semiconductor integrated circuit, comprising:

the memory device of claim 6; and a logic circuit which performs a predetermined operation, wherein the logic circuit has a memorization mode and a process mode, in the memorization mode, the logic circuit stores bit data in the memory device, and in the process mode, the logic circuit retrieves bit data stored in the memory device.

10. A semiconductor integrated circuit, comprising:

the memory device of claim 6; and a processor which has a program execution mode and a program rewrite mode, wherein in the program execution mode, the processor operates according to a program stored in the memory device, and in the program rewrite mode, the processor rewrites a program stored in the memory device to another new program received from outside.

* * * * *